United States Patent
Kiernan et al.

(10) Patent No.: US 11,178,793 B2
(45) Date of Patent: Nov. 16, 2021

(54) IN-ROW COOLING SYSTEM

(71) Applicant: Rahi Systems Inc., Fremont, CA (US)

(72) Inventors: Kenneth W. Kiernan, Walnut Creek, CA (US); Paul A. Weber, Dublin, CA (US); Tarun Raisoni, San Jose, CA (US)

(73) Assignee: Rahi Systems Inc., Fremont, CA (US)

( * ) Notice: Subject to any disclaimer, the term of this patent is extended or adjusted under 35 U.S.C. 154(b) by 229 days.

(21) Appl. No.: 16/011,612

(22) Filed: Jun. 18, 2018

(65) Prior Publication Data

US 2018/0368288 A1    Dec. 20, 2018

Related U.S. Application Data

(60) Provisional application No. 62/521,501, filed on Jun. 18, 2017.

(51) Int. Cl.
*H05K 7/20* (2006.01)
*G06F 1/20* (2006.01)

(52) U.S. Cl.
CPC ........... *H05K 7/20745* (2013.01); *G06F 1/20* (2013.01); *G06F 1/206* (2013.01); *H05K 7/20836* (2013.01); *G06F 2200/201* (2013.01)

(58) Field of Classification Search
CPC .................................................. H05K 7/20745
USPC .......................................................... 454/184
See application file for complete search history.

(56) References Cited

U.S. PATENT DOCUMENTS

| | | | |
|---|---|---|---|
| 7,365,973 B2* | 4/2008 | Rasmussen | H05K 7/2079 361/694 |
| 2008/0123288 A1* | 5/2008 | Hillis | H05K 7/1497 361/679.34 |
| 2013/0333401 A1* | 12/2013 | Long | F24F 1/0059 62/62 |
| 2015/0193325 A1* | 7/2015 | Harsan-Farr | G06F 11/3409 702/186 |
| 2018/0352683 A1* | 12/2018 | Karrat | F24F 11/00 |

* cited by examiner

*Primary Examiner* — Vivek K Shirsat
(74) *Attorney, Agent, or Firm* — Horizon IP Pte Ltd (57) ABSTRACT

A framework for in-row cooling is described herein. The cooling system employs a fan unit with a plurality of smaller fans for improving the spread of air flowing through a V-shaped heat exchanger. The use of multiple smaller fans and the V-shaped heat exchanger enables the cooling system to be cooled using ambient temperature water or processed water at ambient temperature.

20 Claims, 9 Drawing Sheets

| Specifications | | |
|---|---|---|
| MPN | ECX1000IBE9-R-H | |
| Environment | 45°C 17%RH | |
| In/Out Water Temperature | 21°C/28.7°C ( Δt=7.7°C ) | |
| Cooling Power | 75.5KW | |
| Dimensions | 900*1200*2089 ( not include casters ) | |
| Input Power | 208V 3P 60HZ | |
| Water Pipe configure | Top and Bottom | |
| Option | Water Chiller | |

501

502

| 78~80°F LAT | 70°F (21°C) EWT 14°F (7.7°C) Water Rise | 72°F (22°C) EWT 14°F (7.7°C) Water Rise |
|---|---|---|
| 113°F DB, 71°F WB (45°C DB, 21.6°C WB) 17% RH | | |
| Total Airflow, CFM (m3/h) | 7200 | 6120 |
| Total kW (BTU/H) | 47.0 | 38.4 |
| Sensible kW (BTU/H) | 47.0 | 38.4 |
| Flow Rate, l/s (GPM) | 1.46 | 1.19 |
| Pressure Drop, ft H2O (kPa) | 65 | 63 |
| 105°F DB, 71°F WB (40.6°C DB, 21.6°C WB) 17% RH | | |
| Total Airflow, CFM (m3/h) | 7200 | 6120 |
| Total kW (BTU/H) | 35.0 | 27.2 |
| Sensible kW (BTU/H) | 35.0 | 27.2 |
| Flow Rate, l/s (GPM) | 1.09 | 0.85 |
| Pressure Drop, ft H2O (kPa) | 64 | 61 |
| 100°F DB, 69.5°F WB (37.8°C DB, 20.8°C WB) 20% RH | | |
| Total Airflow, CFM (m3/h) | 7200 | 6120 |
| Total kW (BTU/H) | 30.0 | 23.8 |
| Sensible kW (BTU/H) | 30.0 | 23.8 |
| Flow Rate, l/s (GPM) | 0.93 | 0.74 |
| Pressure Drop, ft H2O (kPa) | 62 | 59 |
| 95°F DB, 67.9°F WB (35°C DB, 19.9°C WB) 23% RH | | |
| Total Airflow, CFM (m3/h) | 7200 | 6120 |
| Total kW (BTU/H) | 23.0 | 17.5 |
| Sensible kW (BTU/H) | 23.0 | 17.5 |
| Flow Rate, l/s (GPM) | 0.72 | 0.54 |
| Pressure Drop, ft H2O (kPa) | 60 | 55 |
| 90°F DB, 66.2°F WB (32.2°C DB, 19.0°C WB) 27% RH | | |
| Total Airflow, CFM (m3/h) | 7200 | 6120 |
| Total kW (BTU/H) | 15.0 | 11.0 |
| Sensible kW (BTU/H) | 15.0 | 11.0 |
| Flow Rate, l/s (GPM) | 0.47 | 0.34 |
| Pressure Drop, ft H2O (kPa) | 54 | 53 |

IN-ROW COOLING SYSTEM

CROSS-REFERENCE TO RELATED APPLICATION

The present application claims the benefit of U.S. provisional application No. 62/521,501 filed on Jun. 18, 2017, the entire contents of which are herein incorporated by reference.

TECHNICAL FIELD

The present disclosure generally relates to temperature controls, and more particularly to cooling systems for information technology (IT) systems.

BACKGROUND

With increasing heat density of servers, as well as the growing role of energy costs, cooling has become an important issue, particularly in data centers. While it is generally known that power consumption is the primary challenge for future high-performance computing systems, there can be a myopic focus on the issue by assuming power is consumed by the computer hardware only, without accounting for the necessary increase in cooling power that is required for highly integrated, more densely packaged information technology (IT) hardware.

Furthermore, traditional coolers, such as computer room air conditioners (CRACs) or computer room air handlers (CRAHs), are generally physically too large as well as provide too much cooling capacity. Such types of cooling devices consume excessive amounts of energy, rendering them operationally inefficient.

Based on the foregoing discussion, there is a need for efficient and effective cooling of, for example, data centers.

SUMMARY

Described herein is an in-row cooling framework. In one embodiment, a cooling system is described. The cooling system includes a cooling system housing, a plurality of fan modules, a heat exchanger, and conduits. The cooling system housing has at least opposing front and rear sides. The plurality of fan modules has a plurality of fans, wherein fans of the fan modules are configured as smaller fans to fit on the rear side of the cooling system housing. The heat exchanger including a V-shaped coil is disposed within the cooling system housing. During operation, conduits facilitate circulating a cooling fluid through the heat exchanger. The plurality of fan modules creates improved air flow spread and the V-shaped coil produces increased surface area of the heat exchanger to increase cooling efficiency of the cooling system.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings.

DETAILED DESCRIPTION

In the following description, numerous specific details are set forth such as examples of specific components, devices, methods, etc., in order to provide a thorough understanding of implementations of the present framework. It will be apparent, however, to one skilled in the art that these specific details need not be employed to practice implementations of the present framework. In other instances, well-known materials or methods have not been described in detail in order to avoid unnecessarily obscuring implementations of the present framework. While the present framework is susceptible to various modifications and alternative forms, specific embodiments thereof are shown by way of example in the drawings and will herein be described in detail. It should be understood, however, that there is no intent to limit the invention to the particular forms disclosed; on the contrary, the intention is to cover all modifications, equivalents, and alternatives falling within the spirit and scope of the invention. Furthermore, for ease of understanding, certain method steps are delineated as separate steps; however, these separately delineated steps should not be construed as necessarily order dependent in their performance.

A high-density in-row cooling system or cooler is described herein. In accordance with one aspect, the dimensions (e.g., height, depth, breadth) of the surface area for thermal exchange in the present cooling system are larger than typical systems so as to dramatically enhance cooling capacity for a given footprint. For example, a single form factor in-row cooling system may provide up to about 100 kW of sensible cooling at a footprint of 600×1200×2089. For example, the in-row cooling system may provide about 75 kW of sensible cooling. The cooling system may include a plurality of fans configured in multiple modules of fans, such as 9 modules. Providing multiple modules advantageously provides more modular spread across the surface area for improved cooling. This also advantageously enables repair with minimal interruption in service.

In accordance with another aspect, variable flow rates are controlled and monitored through the increased surface area to allow operation of the system with non-chilled water at, e.g., ambient temperature or 73° F., instead of chilled water. Advantageously, the cooling system does not require any compressors to chill the water, which makes it extremely energy efficient. The cooling system is able to utilize the higher temperature supply water and run the overall containment at a higher temperature, thus removing the requirement for a dedicated chilling plant that typically provides 45-60° F. chilled water. However, an existing chilled water source may also be used if desired to increase the capacity of sensible cooling. For example, about 100 kW of sensible cooling may be achieved with the use of chilled water.

Existing systems provide large perimeter computer room air conditioner/computer room air handler (CRAC/CRAH), air handling unit (AHU) and in-row cooling (IRC) up to 40 kW and consumes up to 30-40% of total data center power PUE (power usage effectiveness). Similar capacity may be obtained through multiple units, which increases the number of failure points. Unlike existing systems, the present in-row cooling system advantageously provides high cooling capacity (up to 100 kW), a small footprint, high energy efficiency (with no compressors) and a special end-to-end method of manufacture, integration and distribution. These and other features and advantages will be described in more details herein.

Figures 1A, 1B:
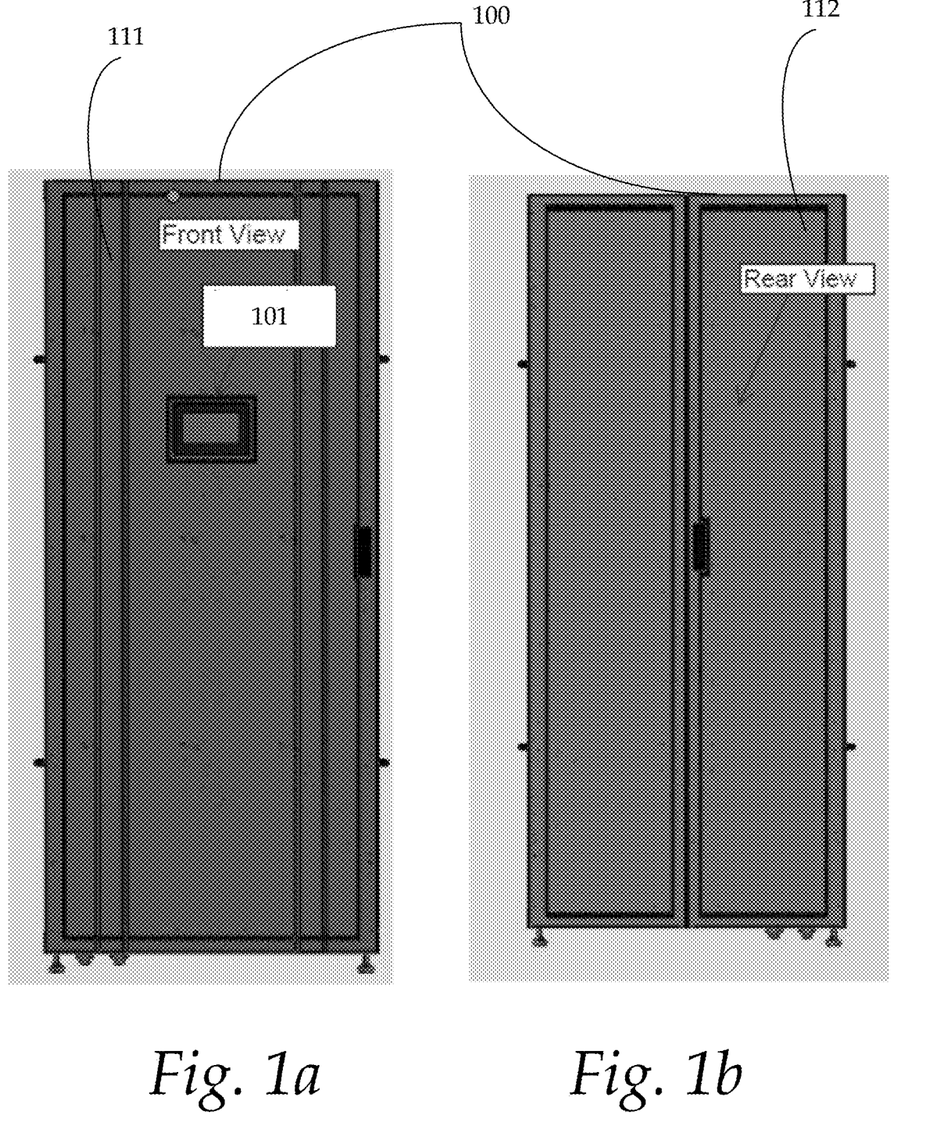
FIGS. 1a-e show various views of an exemplary in-row cooling system.

FIGS. 1a-e show various views of an exemplary in-row cooling system or cooler 100. More particularly, FIG. 1a shows a front view and FIG. 1b shows a rear view of the exemplary in-row cooling system 100. The in-row cooling system 100 includes a housing that has a front panel 111, a rear panel 112, and top, bottom and two side panels (not shown). A control panel 101 is provided for the cooling system. The control panel, for example, may be positioned on the front panel 111 for providing a user interface, such as a human machine interface (HMI), to display, access, manipulate and/or manage various control parameters (e.g., fan speed, temperature, control valve position). The control panel 101 may be, for example, a touchscreen interface that displays information and is responsive to user touch events. Other types of control panels are also useful. The housing may support various other components for cooling, such as a set of fan modules which includes a plurality of fans for moving air over a heat exchanger, sensors, and a control system (not shown) for monitoring and managing various control parameters in response to, for example, user input and/or sensor feedback data to achieve precision and efficiency.

The front panel 101, for example, may be rotatably secured to the housing and pivotable about one or more stationary hinges, enabling it to open and close. As for the rear panel 112, it may include one or more hinged doors that are pivotable about stationary hinges to provide access to interior components. Accessing the interior components facilitate servicing and repairing of the cooling system. The front and rear panels may be opened to provide access for different internal components. For example, the front panel may be opened to provide access to the heat exchanger while the rear panel may be opened to provide access to the electrical panel, condensate pump, fan coil as well as other interior components. Other configurations of accessing the internal components may also be useful.

Figure 1C:
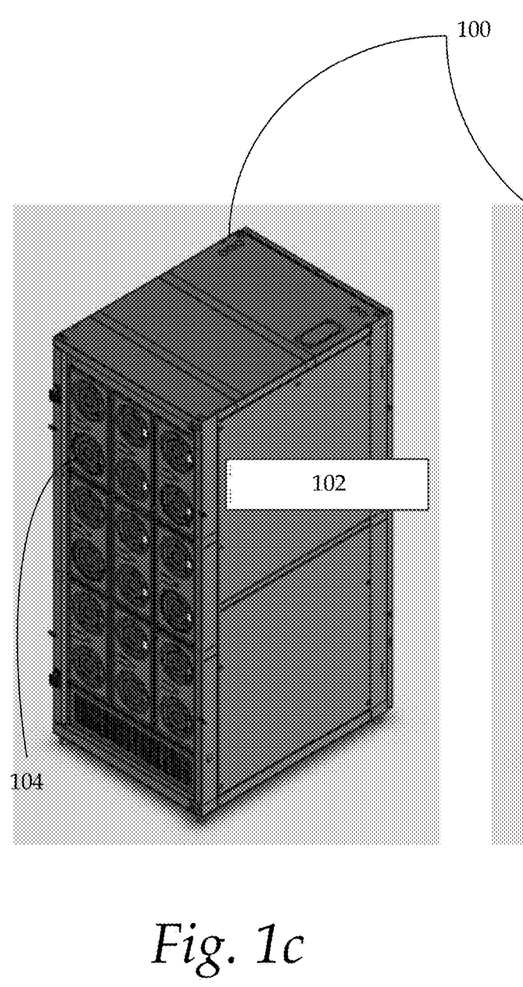
Figure 1D:
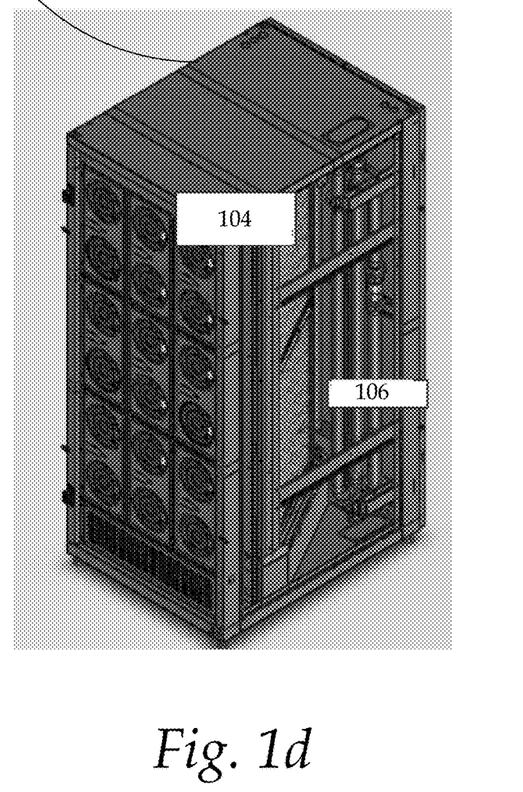

FIG. 1c shows a side perspective view of the exemplary in-row cooling system 100 with the side panel 102 in place and the rear panel 112 removed. FIG. 1d shows the same side view of the in-row cooling system 100 with the rear panel 112 and side panel 102 removed. In some implementations, a fan unit is provided at the rear of the housing. The fan unit includes. In one embodiment, a plurality of fan modules 104. A fan module, for example, may include a pair of fans. Providing a module with other numbers of fans, including a single fan, may also be useful. For example, a fan module may include more or less than 2 fans. In some embodiments, the fan modules may have different numbers of fans. For example, one or more fan modules of the fan unit may have two fans and one or more fan modules may have one fan.

In one embodiment, fan modules are configured to be modular. In one embodiment, the modules are configured to have a similar size such that fan modules can easily be swapped for repair as well as swapping for different fan number modules. For example, a 2-fan module can be swapped with two 1-fan modules or a 2-fan module and a 1-fan module can be swapped for a 3-fan module. The use of fan modules facilitates repair without interrupting operation of the cooling system. For example, the fan modules may be hot-swappable fan modules 104 which advantageously enable repair with minimum interruption in service. Furthermore, providing a plurality of fans or fan modules advantageously creates a more modular spread of air to improve cooling.

In addition, the fans have variable speeds, for example, 18 different speeds. Providing fans with other numbers of speeds may also be useful. For example, a fan may be ramped up from 0% to 100% of the fan's revolutions per minute (rpm) capacity. In some implementations, the speeds of the fans are automatically monitored and controlled by a control system in response to sensor data feedback. This facilitates efficient operation of the cooling system. For example, higher or lower speeds may be configured for the fans based on sensor readings. Furthermore, different fans or fan modules may be controlled to be at different operating speeds based on sensor readings.

In one embodiment, the fan unit includes 18 fans. The 18 fans, for example, are provided by nine 2-fan modules 104. The fan modules 104 are arranged in rows. For example, the fan modules are arranged in 3 rows of three 2-fan modules, with each 2-fan module arranged in a vertical direction. It should be appreciated that other configurations of fan modules may also be provided. In another embodiment, the fan unit includes 15 fans. For example, the fan unit may include 2 rows of three 2-fan modules, each arranged in the vertical direction, and 1 row of three 1-fan modules. Other configurations of fan units and fan modules may also be useful. Providing numerous smaller fans, for example, at least 10 fans and preferably at least 15, creates better spread of air which improves cooling as compared to conventional use of a single pair of larger fans.

Air from the external environment is drawn into the cooling system by fans 104. For example, hot air from an aisle of servers is drawn into the cooling system. The hot air passes through the heat exchanger 106 and is cooled. The cooled air exits the cooling system into an aisle, thereby cooling the aisle.

A cooling fluid circulates through the heat exchanger 106. In one embodiment, the cooling fluid circulates through the heat exchanger using a pump. In one embodiment, the pump is external to the cooling system. Providing a pump which is internal to the cooling system may also be useful. The cooling fluid, in one embodiment, includes water or processed water. For example, the cooling fluid may be condenser water. The cooling fluid, in some implementations, is at or processed at ambient temperature. The ambient temperature, for example, is at about 69 to 72.° F. Unlike typical systems, the cooling system 100 is able to utilize the higher temperature supply water and runs the overall containment at a higher temperature, thus reducing the need for a dedicated chilling plant that provides chilled water, which typically is at about 45-60° F. Since chilled water is not required, the cooling system 100 is advantageously very energy efficient. Alternatively, the cooling system may employ chilled water as the cooling fluid. For example, the chilled water may be at 45-60° F. The use of chilled % ater as the cooling fluid increases the capacity of sensible cooling.

Figure 1E:
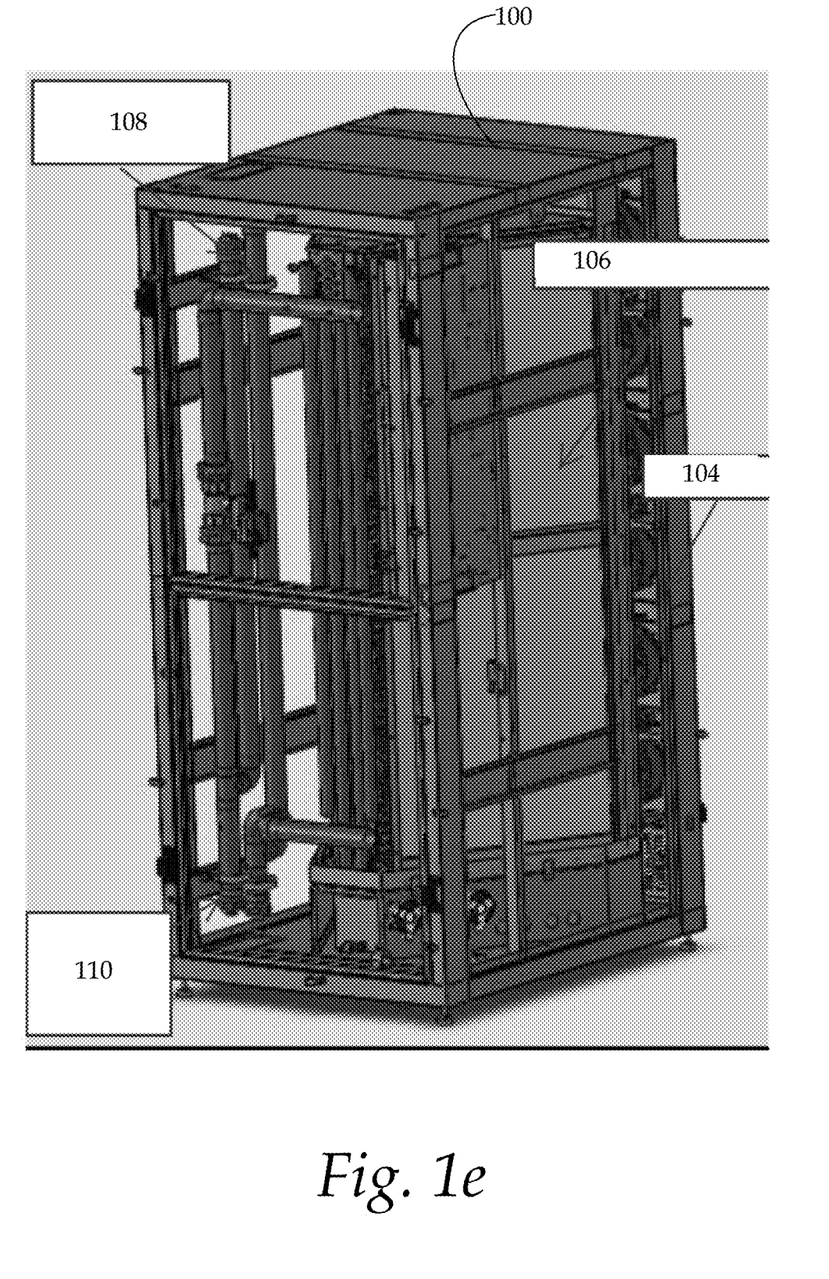

FIG. 1e shows an interior perspective view of the in-row cooling system 100 with the front panel 111 and side panels removed. As shown, the cooling system includes conduits, such as pipes, which facilitate circulating the cooling fluid through the heat exchanger. In one embodiment, the conduits include a return conduit and an exit conduit. As shown, the return conduit includes an upper or first inlet 108. The upper inlet may be coupled to a cooling fluid supply with a return system via an outlet of the exit conduit. This, for example, forms a closed loop for circulating the cooling fluid through the heat exchanger. In one embodiment, the cooling fluid supply and return system are disposed external to the cooling system. This facilitates a compact cooling system. Other configurations of the cooling fluid supply and return system may also be useful. For example, the cooling fluid supply and/or return system may be internal to the cooling system.

In one embodiment, the return conduit may include a lower or second inlet 110. The lower inlet may serve as an alternate inlet to be coupled to an external cooling fluid supply. For example, the external cooling fluid supply may be disposed under the floor of the facility in which the unit is installed. The external cooling fluid supply may be coupled to the return system which is coupled to the outlet of the exit conduit. Other configurations of cooling fluid supply and return systems may also be useful.

The upper and lower inlet each includes an inlet control valve. The inlet control valve can be set in the opened or closed position using the control panel. Depending on the implementation, the control valves may be appropriately set. For example, if the upper inlet is used, the control valve for the upper inlet is set in the opened position while the control valve for the lower inlet is set in the closed position. The valves, for example, may be set based on the setting that is configured using the control panel or HMI. In some cases, both inlets may be active. For example, both inlets may provide cooling fluid to the cooling system.

Figure 2:
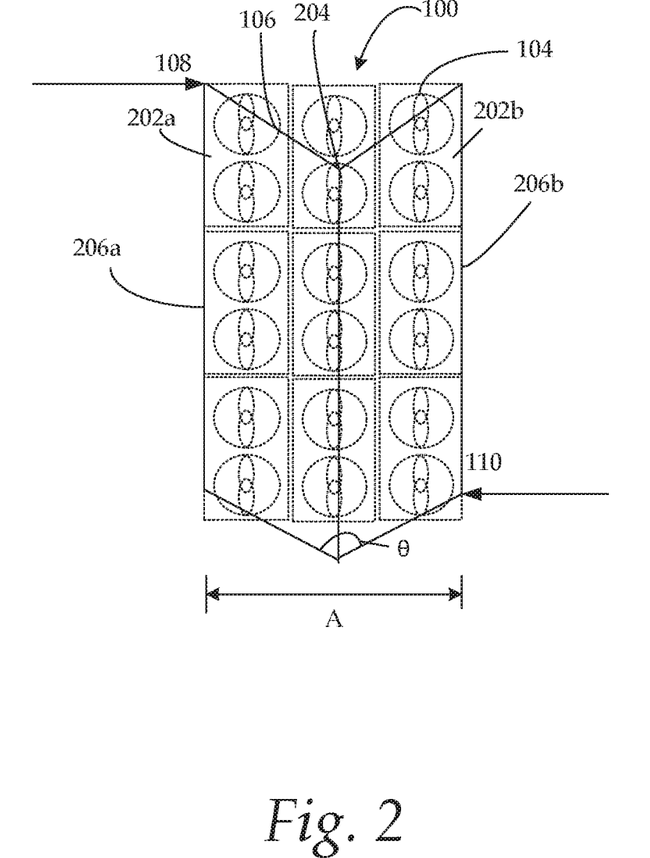
FIG. 2 shows a front interior schematic view of an exemplary in-row cooling system.

FIG. 2 shows a front interior schematic view of an exemplary in-row cooling system 100. In some implementations, the heat exchanger 106 has a V-coil configuration to maximize cooling capacity. The V-coil configuration, as shown, includes two cooling plates 202a-b that are joined at an angle θ along a vertical edge 204 to form a V-shape. Preferably, the cooling plates are symmetrical. The angle θ may be about 60°-110°. Configuring the V-coil at other angles may also be useful. For example, θ may be less than 60° or greater than 110°. The opposing vertical edges 206a-b of the cooling plates 202a-b are separated by a predetermined distance A to form a V-shape in front of the fan modules 104. The distance A depends on angle θ. However, the distance A should be smaller than the footprint of the cooling system, enabling the heat exchanger to be contained therein.

The vertex of the V-shape, as shown, points towards the front of the in-row cooling system 100. For example, warm air is drawn in from the rear by the fans and directed to the heat exchanger. The warm air is cooled by the heat exchanger and exits the cooling system through the front. Each cooling plate 202a-b may include cooling fins to increase the surface area for heat transfer. The density of fins may be, for example, 14 fins per inch. Other densities are also useful. Variable flow rates of the cooling fluid through the increased surface area may be controlled and monitored by the control system in response to sensor data feedback.

Configuring the heat exchanger in a V-coil configuration increases surface area of the heat exchanger for a given footprint as compared to non-V-coil configurations, such as slanted or slab type coils. Increasing surface area of the heat exchanger improves cooling efficiency and capacity of the cooling system. In other embodiments, multiple cooling plates are provided and joined at angles, creating a coil with multiple V-grooves. For example, three cooling plates may be joined to form 2 V-grooves. Other numbers of cooling plates may also be useful. It is understood that the angles between different cooling plates need not be the same.

Controls, in one embodiment, are integrated into the cooling system unit for managing the cooling system unit. For example, controls may be provided to control the rate of fan speed and rate of water flow based on either the supply air (cold) temperature or the return air (warm) temperature. Based on the settings, the unit will increase or decrease the water flow rate and fan speed to maintain the desired operational conditions.

Figure 3:
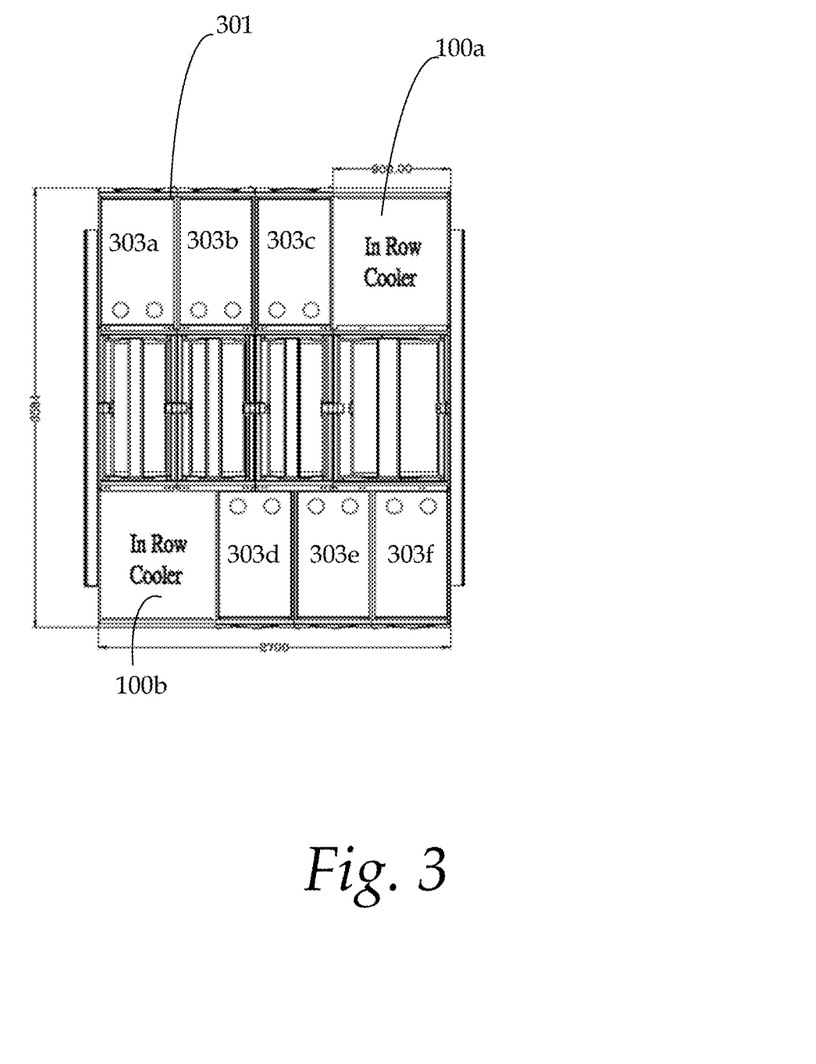
FIG. 3 shows an exemplary configuration in a data center.

FIG. 3 shows an exemplary configuration 301 in a data center. The data center configuration 301 includes two in-row cooling systems 100a-b disposed within two respective rows of server cabinets 303a-f to provide localized cooling. Each in-row cooling system 100a-b occupies about 1.5 times (e.g., 900 mm) of a standard 19 inch rack of row space without additional side clearance. The server cabinets 303a-f are designed to support heat generating electronic equipment, such as servers, processors, power units, etc. Although only two rows of server cabinets 303a-f are shown, it should be appreciated that the number of server cabinets may be increased or decreased depending on requirements.

The rows of server cabinets are arranged in such a manner that there are cold aisles and hot aisles. The cold aisles provide access to the front of the server cabinets, while the hot aisles provide access to the back of the server cabinets. Each in-row-cooling system 100a-b draws in warm exhaust air heated by the heat generating electronic equipment directly from a hot aisle, cools it to, for example, slightly below or at ambient temperature, and distributes it to a cool aisle.

Figure 4:
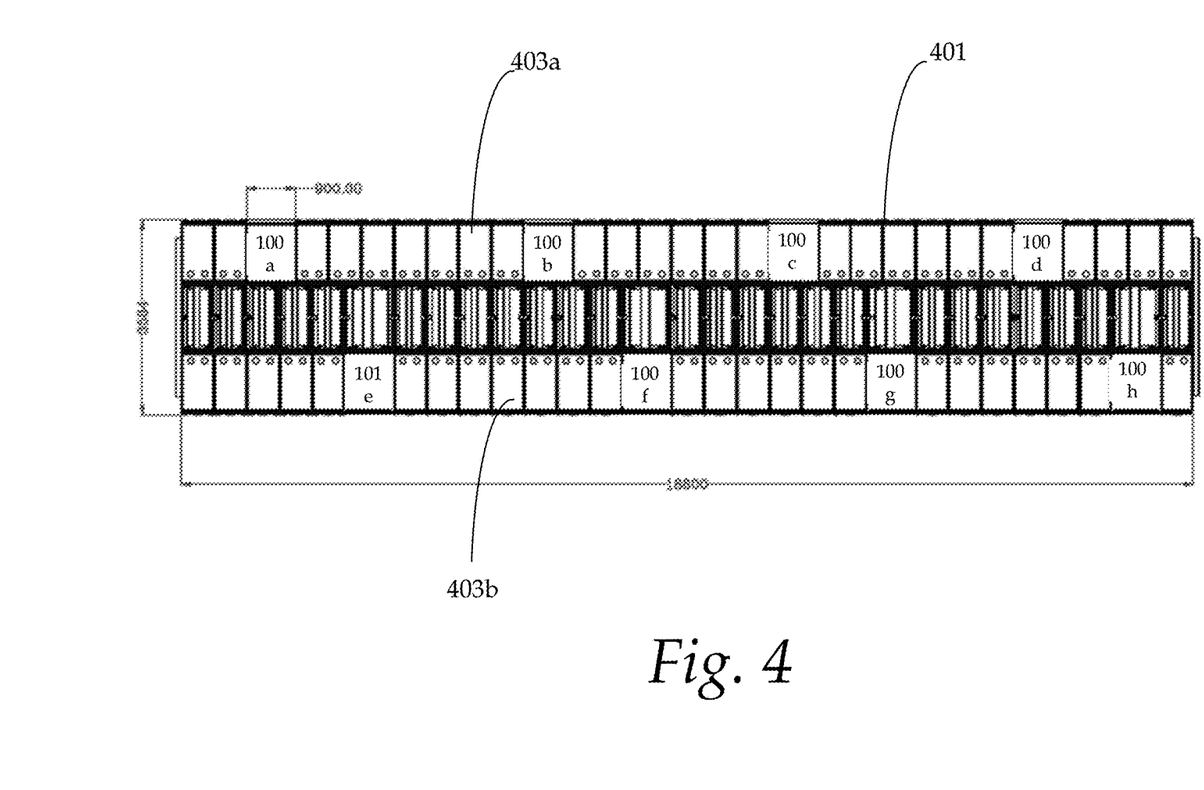
FIG. 4 shows another exemplary configuration in a high-density data center.

FIG. 4 shows another exemplary configuration 401 in a high-density data center. Multiple in-row cooling systems (100a-d or 100e-h) are interspersed within each row of server cabinets (403a or b) to more efficiently cool the data center. More particularly, 4 in-row cooling systems (100a-d or 100e-h) are interspersed between server cabinets within each row of 25 server cabinets (403a or b). It should be appreciated that other types of configurations are also useful.

Figure 5:
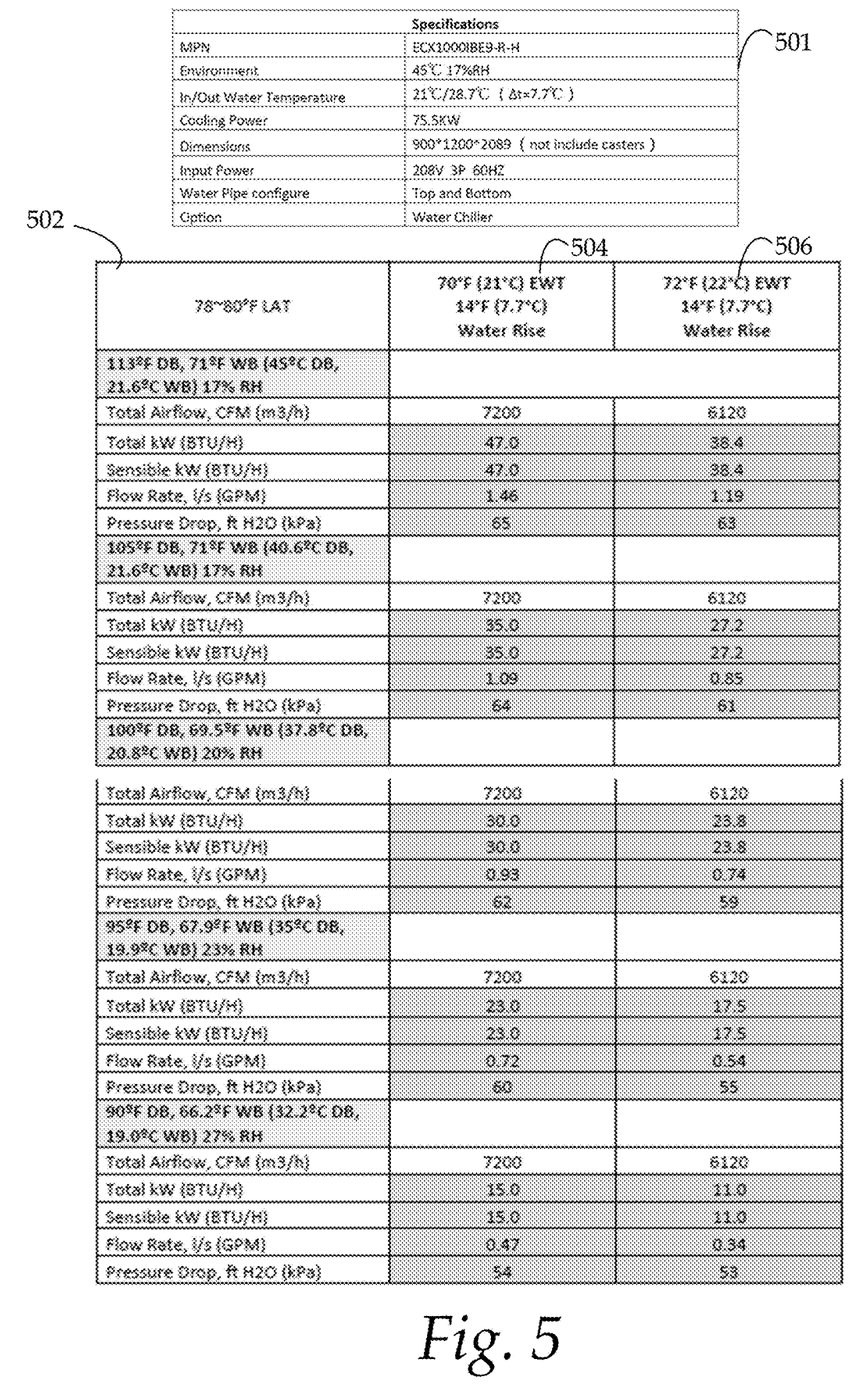
FIG. 5 illustrates specifications of an exemplary in-row cooling unit.

FIG. 5 illustrates specifications of an exemplary in-row cooling unit. More particularly, table 501 shows the operating specifications and table 502 shows the performance specifications for the exemplary in-row cooling unit with different entering water temperatures (EWT). Column 504 shows the performance at EWT=70° F., while column 506 shows the performance at EWT=72° F., It should be noted that the net capacity data has fan motor heat factored in for all ratings. Capacity data may be factory-certified with 5% tolerance. The data is rated with a standard minimum efficiency reporting value 8 (MERV8) filter.

Figure 6:
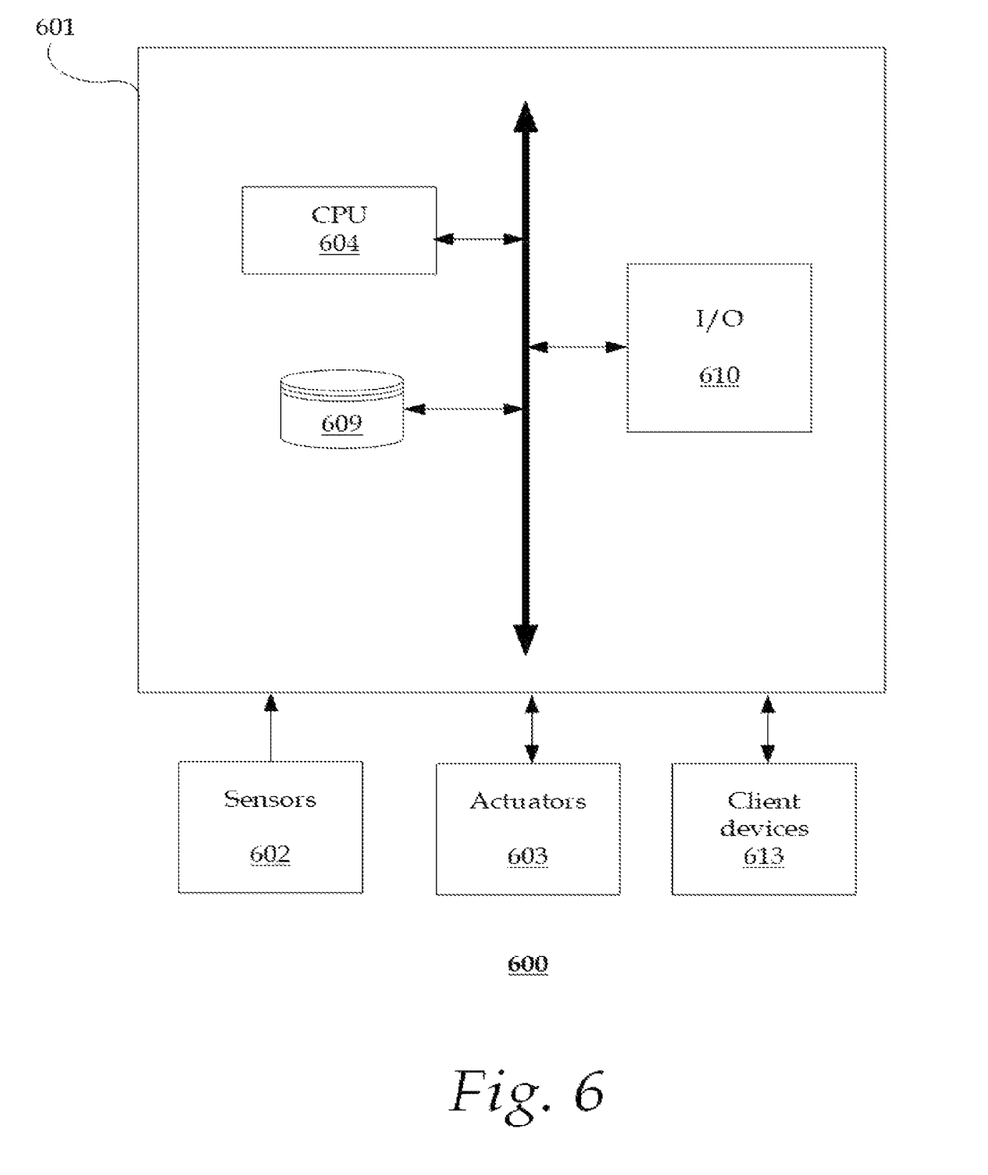
FIG. 6 shows an exemplary control system.

FIG. 6 shows an exemplary control system 600. The exemplary control system 600 may be incorporated in the in-row cooling system 100 described with reference to FIGS. 1a-e and 2. The control system includes a controller 601. The controller, for example, may include a processor unit 604, a storage unit 609 and input/output (I/O) unit 610. The storage unit may store a computer program for controlling and managing operation of the in-row cooling system of the data center. As for the I/O unit, it may include a display for displaying a user interface used in controlling and managing the in-row cooling system. The display may be a touch screen display with a soft keyboard for inputting information. In addition, the I/O unit may include a keyboard for inputting information. The control system communicates sensors 602, actuators 603 and client devices 613. The sensors may include, for example, temperature sensors, airflow sensors and coolant flow sensors as well as other types of sensors. As for the actuators, they may include control valves for the water supply and fan speed control as well as other types of actuators. Client devices may be devices which can connect and communicate with the control system.

Figure 7:
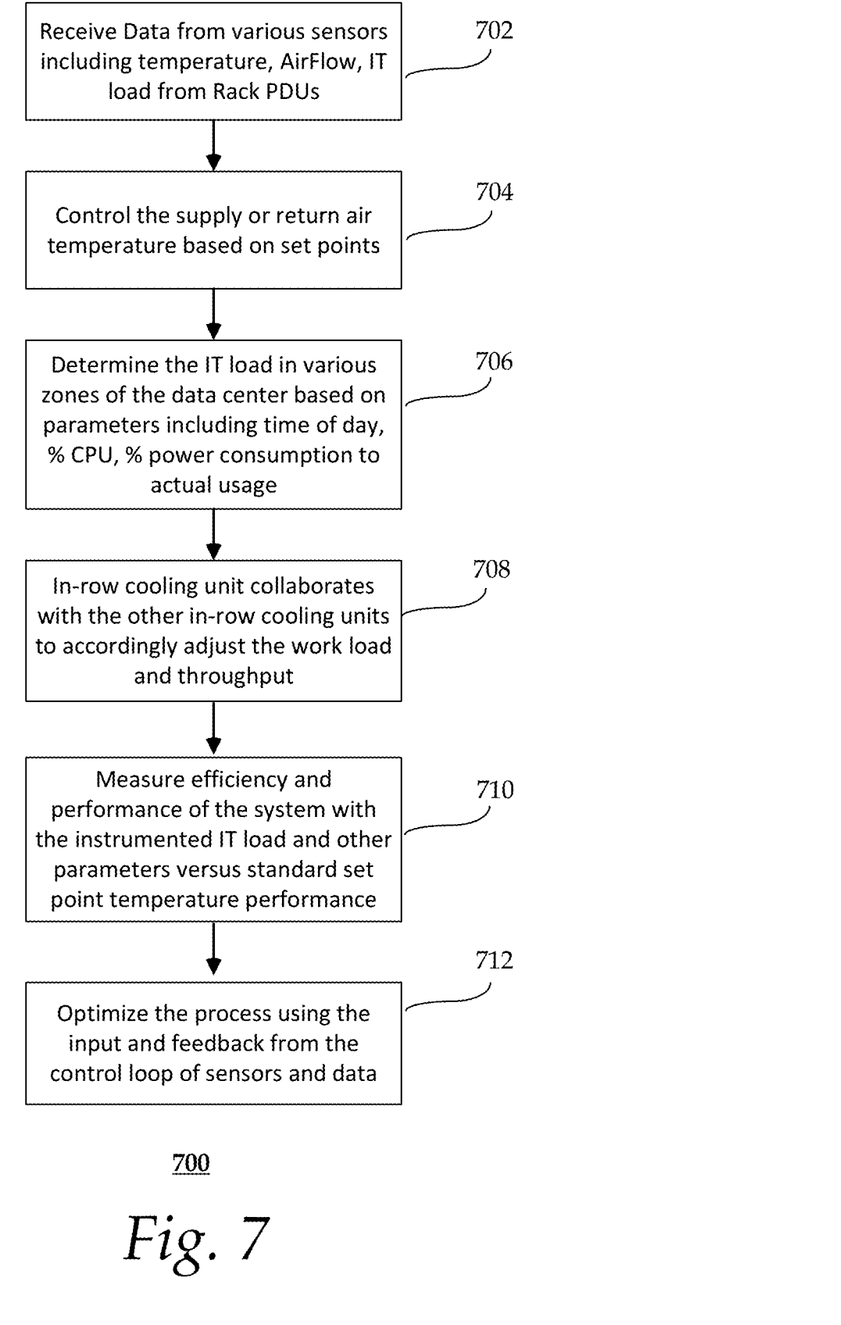
FIG. 7 shows an exemplary method of managing the in-row cooling system.

FIG. 7 shows an exemplary method 700 of managing the in-row cooling system. It should be understood that the steps of the method 700 may be performed in the order shown or a different order. Additional, different, or fewer steps may also be provided. Further, the method 700 may be implemented with the system 600 of FIG. 6, a different system, or a combination thereof.

Initially, at step 702, data from various sensors in the data center is retrieved. For example, the retrieved data may include temperature data, airflow data, and IT load data from the server rack power distribution units (PDUs). Based on the information retrieved, supply or return air temperature in the data center is controlled based on set points at step 704. The IT load in various zones of the data center can be determined at step 706. The load can be determined based on the information retrieved. The IT load is determined based on various parameters, including time of day, percentage of central processor unit (CPU) usage, and percentage of power consumption to actual usage. Basing IT load on other para may also be useful.

At step 708, the various in-row cooling units are configured to collaborate with each other to cool the data center. For example, the in-row cooling units may be linked together in what may be referred to as a teamwork mode. The in-row cooling units may be programmed based on IT load according to location and time of day. For example, different cooling units are programmed based on respective IT load according to location and time of day.

At step 710, the efficiency is measured with the instrumented IT load and other parameters against standard set point temperature performance.

Based on the results, at step 712, the settings of the in-row cooling units may be optimized to improve efficiency using the input and feedback from the control loop of the sensors and data. In one embodiment, in teamwork mode, the in-row cooling units may communicate with each other and adjust automatically based on the settings of each of the units to improve cooling efficiency based the selected temperature set points. The data center may be continuously monitored and adjusted to optimize efficiency.

In accordance with yet another aspect, a control system that manages the in-row cooler (IRC) is provided. The control system may include local and/or remote sensors that are mounted on-board to monitor temperature, humidity, and/or pressure differential (PD) of the supply air and/or return air. Additional remote wireless sensors may be mounted in the front of the server or the rear of the server rack (e.g., top, middle, bottom) to feedback data to the IRC. The control system may manage various parameters (e.g., fan speed, control valve position, compressor speed) in response to the sensor feedback data to achieve precision and efficiency. Fans may be decoupled from capacity (valve/compressor) control. The control system may be integrated with other systems (e.g., ZPE™ Systems console, NodeGrid Manager®). The control system may include automation logic and programmable controls (local and/or remote) and can be capable of remote control and monitoring. The control system may further be communicatively coupled via, e.g., Bluetooth, to client devices installed with a mobile application (App) with a control interface.

While the present framework has been described in detail with reference to exemplary embodiments, those skilled in the art will appreciate that various modifications and substitutions can be made thereto without departing from the spirit and scope of the invention as set forth in the appended claims. For example, elements and/or features of different exemplary embodiments may be combined with each other and/or substituted for each other within the scope of this disclosure and appended claims.

What is claimed is:

1. An in-row cooling system for a data center comprising:
    a cooling system housing having at least opposing first and second opposing sides;
    a plurality of distinct fan modules having a plurality of fans, the fan modules are disposed at the first side (fan side) of the cooling system housing and within a single plane of the first side, wherein the fan modules are arranged along a first direction (row) and a second direction (column) perpendicular to each other within the single plane of the first side;
    a heat exchanger disposed adjacent to the fan modules within the cooling system housing and proximate to the first side (fan side) of the cooling system housing, wherein the heat exchanger comprises a V-shaped coil, wherein a vertex of the V-shaped coil is disposed proximate to the second side (non-fan side) of the cooling system housing away from the first side of the cooling system housing;
    conduits for facilitating circulating a cooling fluid through the heat exchanger during operation, wherein the cooling fluid comprises unchilled water from an unchilled water source; and
    wherein
        the V-shaped coil results in an increased surface area compared to a planar-shaped coil, and
        locating the V-shaped coil adjacent to the fan modules with the vertex of the V-shaped coil disposed away from the fan modules improves a cooling capacity of the in-row cooling system.

2. The in-row cooling system of claim 1 wherein the cooling capacity of the in-row cooling system is managed by a control unit which controls a fan speed of the plurality of fans and a flow rate of the cooling fluid.

3. The in-row cooling system of claim 1, wherein circulating the unchilled water from the unchillled water source provides sufficient cooling without using a chilled cooling fluid which is cooled below an ambient temperature to reduce energy consumption.

4. The in-row cooling system of claim 1, wherein the fan modules are configured as modular fan modules wherein:
    the modular fan modules of the in-row cooling system comprise same size fans to facilitate interchangeability of the modular fan modules; and
    the modular fan modules are configured to be hot swapped to facilitate repairs without shutting down the in-row cooling system.

5. The in-row cooling system of claim 1, wherein the V-shaped coil includes first and second coil plates joined at an angle to form the vertex of the V-shaped coil.

6. The in-row cooling system of claim 5, wherein the first and second coil plates of the V-shaped coil of the heat exchanger each includes cooling fins, the V-shaped coil has a larger surface area than a planar-shaped coil with a same width and height, wherein the larger surface area of the V-shaped coil increases the cooling capacity of the in-row cooling system.

7. The in-row cooling system of claim 1, wherein the conduits comprise:
    a return conduit, the return conduit includes a return inlet;
    an exit conduit; and wherein the return inlet is coupled to the unchilled water source with a return system, and the return system is coupled to the exit conduit to form a closed loop for circulating the cooling fluid through the heat exchanger.

8. The in-row cooling system of claim 7, wherein the unchilled water source with the return system is external to the in-row cooling system to facilitate a compact cooling system.

9. The in-row cooling system of claim 7 wherein the cooling capacity of the in-row cooling system is managed by a control unit which controls a fan speed of the plurality of fans and a flow rate of the cooling fluid.

10. The in-row cooling system of claim 1, further comprises a control unit having a processor and an interactive unit, the control unit is configured to:
receive signals from a plurality of sensors of the data center;
manage a set of cooling parameters based on the signals received from the plurality of sensors to maintain a pre-set temperature point;
determine a cooling efficiency of the in-row cooling system by comparing a set of data center parameters against the pre-set temperature point's standard performance; and
display the set of cooling parameters on a display of the interactive unit.

11. The in-row cooling system of claim 10, wherein the signals received from the sensors comprise:
temperature data in the data center;
airflow data in the data center; and
IT load data from server rack power distribution units (PDUs), wherein the IT load data is based on parameters comprising,
time of day,
percentage of CPU usage, and
percentage of power consumption to actual usage.

12. The in-row cooling system of claim 11 wherein the cooling efficiency is calculated based on a set of data center parameters associated with a current IT load against the pre-set temperature point's standard performance.

13. The in-row cooling system of claim 10, wherein the control unit is configured to manage the set of cooling parameters by controlling:
a fan speed of the plurality of fans; and
a flow rate of the cooling fluid.

14. The in-row cooling system of claim 10, wherein the control unit is configured to manage a plurality of in-row cooling systems in the data center by a teamwork mode, wherein the teamwork mode enables the plurality of in-row cooling systems to communicate with each other and automatically control the set of cooling parameters of the cooling systems to increase the cooling efficiency.

15. The in-row cooling system of claim 1 wherein the fan-side is a back side of the housing and the non-fan side is a front side of the housing.

16. A method for in-row cooling in a data center, the method comprising:
providing a plurality of in-row cooling systems, wherein an in-row cooling system includes
a housing having at least opposing first and second sides,
a plurality of distinct fan modules disposed at the first side (fan side) and within a single plane of the first side, wherein the fan modules are arranged along a first direction (row) and a second direction (column) perpendicular to each other within the single plane of the first side,
a heat exchanger disposed adjacent to the fan modules within the housing and proximate to the first side (fan side), wherein a vertex of the V-shaped coil is disposed proximate to the second (non-fan) side of the housing away from the first side, wherein locating the V-shaped coil adjacent to the fan modules in the in-row cooling system improves a cooling capacity of the in-row cooling system, and
conduits for facilitating circulating a cooling fluid through the heat exchanger during operation; and
providing the cooling fluid from a cooling fluid source at return inlets of conduits of the plurality of in-row cooling systems for circulating through the heat exchangers of the plurality of in-row cooling systems, wherein the cooling fluid comprises unchilled water from an unchilled water source.

17. The method of claim 16 wherein providing the unchilled water comprises providing the unchilled water at an ambient temperature without requiring chilling the unchilled water below the ambient temperature for circulating through the heat exchangers of the plurality of in-row cooling systems reduces energy consumption.

18. The method of claim 16, wherein the conduits of the plurality of in-row cooling systems comprise:
return conduits with the return inlets;
exit conduits; and
wherein the return inlets are coupled to the unchilled water source with a return system, the return system is coupled to the exit conduits to form closed loops for circulating the cooling fluid through the heat exchangers of the plurality of in-row cooling systems.

19. An in-row cooling system comprising:
a cooling system housing having at least opposing first and second sides;
a plurality of distinct fan modules having a plurality of fans, the fan modules are disposed at the first side (fan-side) of the cooling system housing;
a heat exchanger disposed adjacent to the fan modules within the cooling system housing and proximate to the first side (fan side), wherein the heat exchanger comprises a V-shaped coil, wherein a vertex of the V-shaped coil is disposed proximate to the second (non) fan side of the cooling system housing;
wherein the in-row cooling system circulates a cooling fluid through the heat exchanger, wherein the cooling fluid comprises unchilled water from an unchilled water source; and
wherein locating the V-shaped coil adjacent to the fan modules with the vertex of the V-shaped coil module disposed away from the fan modules improves a cooling capacity of the in-row cooling system.

20. The in-row cooling system of claim 19 wherein the unchilled water from the unchilled water source does not require chilling below an ambient temperature which reduces energy consumption.

* * * * *